(12) United States Patent
Graas et al.

(10) Patent No.: US 6,570,181 B1
(45) Date of Patent: May 27, 2003

(54) SEMICONDUCTOR METAL INTERCONNECT RELIABILITY TEST STRUCTURE

(75) Inventors: Carole D. Graas, Jericho, VT (US); Larry Ting, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 284 days.

(21) Appl. No.: 09/695,374

(22) Filed: Oct. 24, 2000

Related U.S. Application Data
(60) Provisional application No. 60/169,449, filed on Dec. 7, 1999.

(51) Int. Cl.[7] .................................................. H01L 23/58
(52) U.S. Cl. ........................... 257/48; 257/773; 257/774
(58) Field of Search .......................... 257/48, 786, 773, 257/774; 438/11, 14, 16, 18; 324/765

(56) References Cited

U.S. PATENT DOCUMENTS 5,952,674 A * 9/1999 Edelstein et al. .............. 257/48
6,297,644 B1 * 10/2001 Jarvis et al. ................ 324/537

* cited by examiner

Primary Examiner—Minh Loan Tran
(74) Attorney, Agent, or Firm—Mark Courtney; W. James Brady; Frederick J. Telecky, Jr.

(57) ABSTRACT

A semiconductor reliability test structure (10) is formed on a face of a semiconductor substrate. The test structure (10) includes a chain of a plurality of long test links (12) formed of a first semiconductor material, where the plurality of long test links (12) is alternately interconnected by a plurality of short connecting links (14) formed of a second semiconductor material. The test structure (10) further includes first and second bond pads (20, 22) coupled to the first and second ends of the chain, respectively.

18 Claims, 1 Drawing Sheet

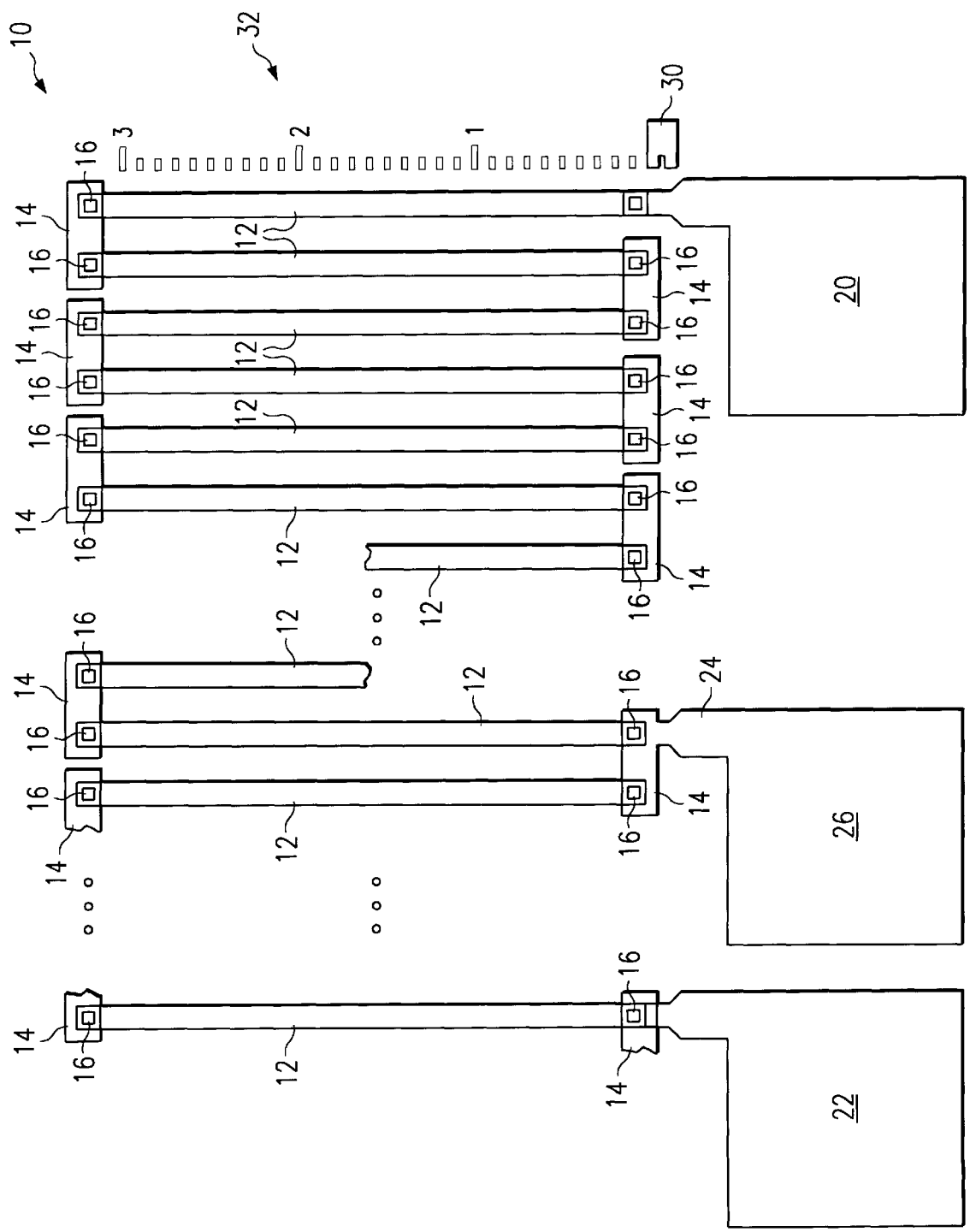

SEMICONDUCTOR METAL INTERCONNECT RELIABILITY TEST STRUCTURE

This application claims priority under 35 USC §119(e)(1) of provisional application No. 60/169,449 filed Dec. 7, 1999.

TECHNICAL FIELD OF THE INVENTION

This invention is related in general to the field of semiconductor processing and testing, and more particularly, to a semiconductor metal interconnect reliability test structure.

BACKGROUND OF THE INVENTION

In sub-half micron metalization systems, reliability-limiting wear out mechanisms include electromigration and stress-induced voiding. To test the reliability of any metalization process, an electromigration and stress void test is conducted on a test structure fabricated with the same processes and technology as the device in question. These tests typically involve subjecting the test structure to high temperature and/or high voltage and current conditions.

Conventional test structures suffer from several disadvantages and do not provide ideal test results for post-testing study and analysis.

SUMMARY OF THE INVENTION

It has been recognized that it is desirable to provide a metal interconnect reliability test structure that enables proper testing of electromigration and stress voiding.

In one aspect of the invention, a semiconductor reliability test structure is formed on a face of a semiconductor substrate. The test structure includes a chain of a plurality of long test links formed of a first semiconductor material, where the plurality of long test links are alternately interconnected by a plurality of short connecting links formed of a second semiconductor material. The test structure further includes first and second bond pads coupled to the first and second ends of the chain, respectively.

In another aspect of the invention, a semiconductor metal interconnect reliability test structure is formed on a face of a semiconductor substrate. The test structure includes a chain formed of a plurality of long test links formed in a first metal layer. The plurality of long test links are alternately interconnected by a plurality of short connecting links formed in a second metal layer. The test structure further includes first and second bond pads formed in the second metal layer and coupled to the first and second ends of the chain, respectively. A plurality of vias connect the first and second metal layers of the long test links and the short connecting links. The plurality of the long test links are generally aligned along a first axis and the plurality of short connecting links are generally aligned along a second axis, the alternating long and short connecting links generally forming a serpentine configuration.

In yet another aspect of the present invention, a semiconductor metal interconnect reliability test structure is formed on a face of a semiconductor substrate. The test structure includes a chain formed of a plurality of long test links formed in a first metal layer. The plurality of long test links are alternately interconnected by a plurality of short connecting links formed in a second metal layer. The test structure further includes first and second bond pads formed in the second metal layer and coupled to the first and second ends of the chain, respectively. A plurality of vias connect the first and second metal layers of the long test links and the short connecting links. The plurality of the long test links are generally aligned along a first axis and the plurality of short connecting links are generally aligned along a second axis, the alternating long and short connecting links generally forming a serpentine configuration. At least one intermediate bond pad is coupled to a short connecting link. A plurality of tick marks are formed on the face of the semiconductor substrate thereby providing a location reference for positions in the plurality of long test links.

BRIEF DESCRIPTION OF THE DRAWINGS

For a better understanding of the present invention, reference may be made to the accompanying drawings, in which:

The FIGURE is a top view of an embodiment of a test structure constructed according to the teachings of the present invention.

DETAILED DESCRIPTION OF THE INVENTION

The FIGURE is a top view of an embodiment of a test structure 10 constructed according to the teachings of the present invention. Test structure 10 is comprised of a chain of interconnected alternating long test links 12 and short connecting links 14 formed on a face of a semiconductor substrate. Long test links 12 are formed in a first metal layer with the same semiconductor fabrication process and technology as the metal interconnect being tested for electromigration and void stress. Short connecting links 14 are formed in a second metal layer and are coupled to long test links 12 by a plurality of vias 16. In general, short connecting links 14 are significantly shorter and wider than long test links 12 so that if failures were to occur, long test links 12 will be the first to fail.

It may be seen that long test links 12 are generally in alignment with a first axis and short connecting links 14 are generally in alignment with a second axis perpendicular to the first axis. In addition, long test links 12 and short connecting links 14 are generally arranged in a pattern or configuration that conserves real estate, such as a serpentine configuration. However, the layout of the chain is not limited to the configuration shown. The layout of the long and short connecting links may take advantage of available real estate on a wafer and be conformed thereto. Further, it is contemplated by the present invention that the shape of short connecting links 14 may differ from that shown in the FIGURE. For example, short connecting links 14 may be curved or curvilinear rather than straight.

Test structure 10 further includes a first bond pad 20 coupled to the first end of the chain and a second bond pad 22 coupled to the second end of the chain. First and second bond pads 20 and 22 may be used to apply a test voltage and current. One or more intermediate bond pads 26 coupled to the chain may also be provided. Intermediate bond pad(s) 26 may be used to divide the chain into two or more sub-chains. Each sub-chain may be separately subjected to different test conditions by applying the high voltage/current to the bond pads defining the sub-chain. For example, the first sub-chain may be tested by applying a test voltage between the first bond pad and an intermediate bond pad. In addition, at least one sub-chain may be used as a reference chain for post-test comparison with the sub-chain subjected to the stresses of the test conditions. As shown in the FIGURE, it may be necessary to provide a tap 24 coupled between the short connecting link and the intermediate bond pad.

The total number of long test links 12 and short connecting links 14 or the number of the links in each sub-chain may vary greatly according to the desired test condition and test results. Further, the length of long test links 12 may also vary greatly.

Post-test analysis is made possible by using a laser to apply a predetermined high temperature to long test links 12 in the chain. When heated in this manner, stress voids become optically detectable or imageable. Test structure 10 further includes a laser focus pad 30 formed in a metal layer on the face of the semiconductor substrate. Laser focus pad 30 is preferably located adjacent to the chain. It is also advantageous to locate laser focus pad 30 near either the first or the second end of the chain, where laser scanning typically begins. Because laser focus pad 30 is used to focus the laser, it is advantageous to locate it adjacent to the chain so that the laser remains in focus as it moves from laser focus pad 30 to the chain.

Test structure 10 further includes a series of tick marks 32 located along long test links 12. Tick marks 32 may be formed of a semiconductor material or metal that is optically visible when test structure 10 is viewed or imaged after the test during analysis and study. The resolution of tick marks 32 (distance between the tick marks) is preferably sufficiently high so that defects of voids detected in long test links 12 may be positionally pinpointed by referring to the tick marks and the labels on the tick marks. For example, a void may be referenced as being located on long test link 1 at the 2.3 tick mark.

It may be seen from the foregoing that the present invention provides a metal interconnect test structure that is able to yield useful electromigration test results in a short test duration due to the thin long test links. The structure is simple so that deprocessing for failure analysis may be easily performed. Further, the test structure is easily scalable by varying the number of long test links, the length of the long test links and the number of long test links in each sub-chain when intermediate bond pads are used. Further, the test structure of the present invention includes the laser focus pad and tick marks to faciliate post-test analysis.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A semiconductor reliability test structure formed on a face of a semiconductor substrate, comprising:
    a chain including a plurality of long test links formed of a first semiconductor material, the plurality of long test links being alternately interconnected by a plurality of short connecting links formed of a second semiconductor material, the chain having first and second ends wherein the long test links are formed in a first layer and the short connecting links are formed in a second layer,
    a plurality of vias connecting the first and second layers of the long and short connecting links; and
    first and second bond pads coupled to the first and second ends of the chain, respectively.

2. The test structure, as set forth in claim 1, wherein the first and second bond pads are formed from the second layer.

3. The test structure, as set forth in claim 1, wherein the plurality of long test links are aligned along a first axis and the plurality of short connecting links are aligned along a second axis.

4. The test structure, as set forth in claim 1, wherein the plurality of long test links are aligned along a first axis and the plurality of short connecting links are aligned along a second axis perpendicular to the first axis.

5. The test structure, as set forth in claim 1, further comprising at least one intermediate bond pad coupled to a short connecting link.

6. The test structure, as set forth in claim 1, further comprising at least one intermediate bond pad coupled to a short connecting link substantially at a mid-point of the chain.

7. The test structure, as set forth in claim 1, further comprising:
    at least one tap coupled to a short connecting link in the chain; and
    at least one intermediate bond pad coupled the tap.

8. The test structure, as set forth in claim 1, further comprising a laser focus pad formed on the face of the semiconductor substrate.

9. The test structure, as set forth in claim 1, further comprising a laser focus pad formed on the face of the semiconductor substrate adjacent to one of the first and second ends of the chain.

10. The test structure, as set forth in claim 1, further comprising a plurality of tick marks formed on the face of the semiconductor substrate providing a location reference for positions in the plurality of long test links.

11. A semiconductor metal interconnect reliability test structure formed on a face of a semiconductor substrate, comprising:
    a chain including a plurality of long test links formed in a first metal layer, the plurality of long test links being alternately interconnected by a plurality of short connecting links formed in a second metal layer, the chain having first and second ends;
    first and second bond pads formed in the second metal layer and coupled to the first and second ends of the chain, respectively;
    a plurality of vias connecting the first and second metal layers of the long and short connecting links; and
    the plurality of long test links being generally aligned along a first axis and the plurality of short connecting links being generally aligned along a second axis, the alternating long test links and short connecting links generally forming a serpentine configuration.

12. The test structure, as set forth in claim 11, further comprising at least one intermediate bond pad coupled to a short connecting link.

13. The test structure, as set forth in claim 11, further comprising at least one intermediate bond pad coupled to a short connecting link substantially at a mid-point of the chain.

14. The test structure, as set forth in claim 11, further comprising:
    at least one tap coupled to a short connecting link in the chain; and
    at least one intermediate bond pad coupled the tap.

15. The test structure, as set forth in claim 11, further comprising a laser focus pad formed on the face of the semiconductor substrate adjacent to one of the first and second ends of the chain.

16. The test structure, as set forth in claim 11, further comprising a plurality of tick marks formed on the face of the semiconductor substrate providing a location reference for positions in the plurality of long test links.

17. A semiconductor metal interconnect reliability test structure formed on a face of a semiconductor substrate, comprising:

a chain including a plurality of long test links formed in a first metal layer, the plurality of long test links being alternately interconnected by a plurality of short connecting links formed in a second metal layer, the chain having first and second ends;

first and second bond pads formed in the second metal layer and coupled to the first and second ends of the chain, respectively;

a plurality of vias connecting the first and second metal layers of the long and short connecting links;

the plurality of long test links being aligned along a first axis and the plurality of short connecting links being aligned along a second axis, the alternating long and short connecting links generally forming a serpentine configuration; and at least one intermediate bond pad coupled to a short connecting link; and a plurality of tick marks formed on the face of the semiconductor substrate thereby providing a location reference for positions in the plurality of long test links.

18. The test structure, as set forth in claim 17, further comprising a laser focus pad formed on the face of the semiconductor substrate adjacent to one of the first and second ends of the chain.

* * * * *